Aug. 4, 1970 A. SHENG 3,523,194
CURRENT MODE CIRCUIT
Filed March 31, 1967
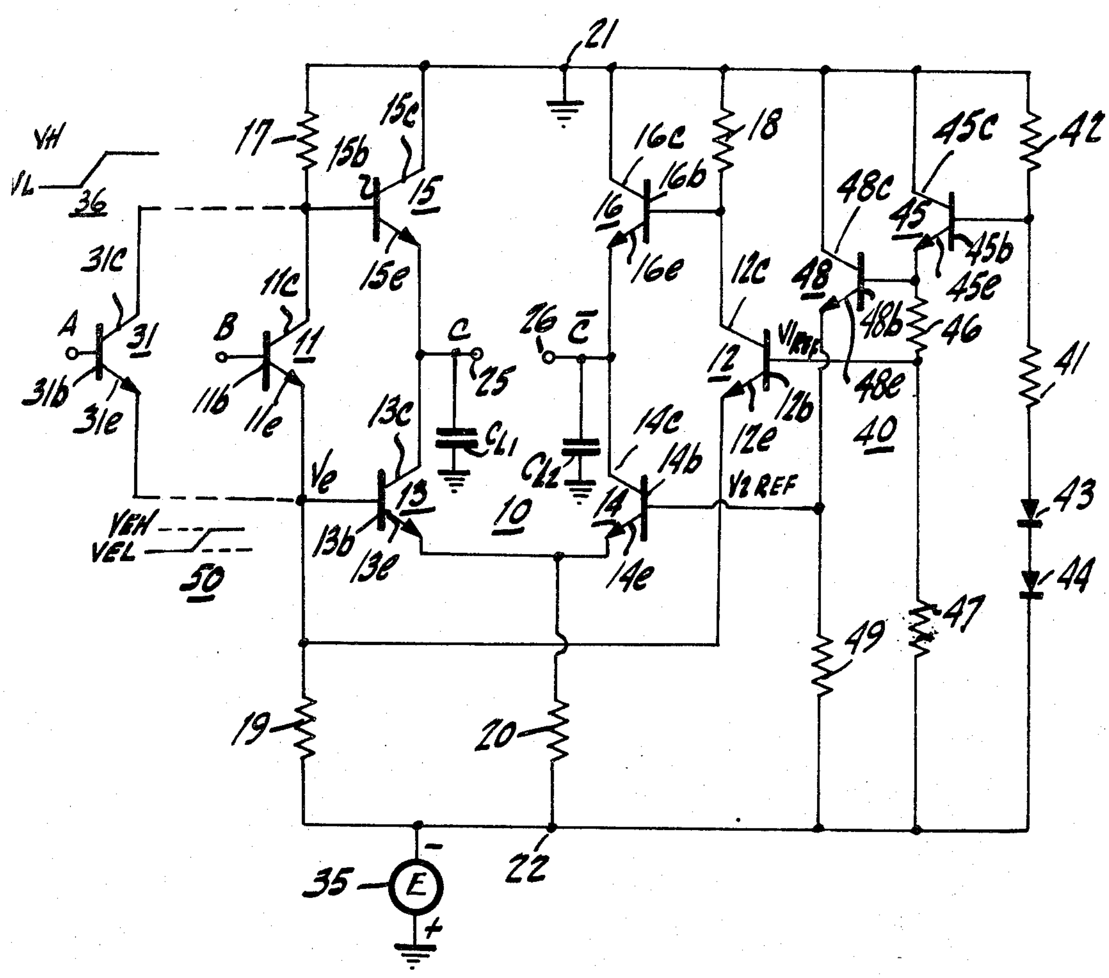
INVENTOR
ALFREDO SHENG
BY John V. Regan
ATTORNEY

United States Patent Office 3,523,194

Patented Aug. 4, 1970

3,523,194

CURRENT MODE CIRCUIT

Alfredo Sheng, Cherry Hill, N.J., assignor to RCA Corporation, a corporation of Delaware Filed Mar. 31, 1967, Ser. No. 627,437

Int. Cl. H03k *17/00*

U.S. Cl. 307—214 1 Claim

ABSTRACT OF THE DISCLOSURE

Current mode switching circuits having dual output emitter-follower output transistors are described. Power dissipation is considerably reduced by switching a common load current path from one to the other output terminal as determined by the binary significance of the digital input signals, whereby the emitter current of only one of the emitter-follower transistors flows through the common path under steady state conditions.

BACKGROUND OF INVENTION

Current mode switching circuits are well suited for high speed digital systems, for example electronic computers and other electronic apparatus, since the transistors therein can be operated out of saturation with relatively small voltage swings, which may be on the order of a fraction of a volt or so. The avoidance of transistor saturation and the small voltage excursions enable current mode switching circuits to have a high speed of response.

One known type of current mode switching circuit includes at least two transistors having separate collector circuits and a common emitter circuit in which a current source is connected. The current source may be simulated by a source of operating potential and a common signal current path, such as a resistor. The current source current can be routed through either one of the alternate current paths provided by the collector-to-emitter paths of the transistors by application of a suitable difference in potential between the base electrodes thereof. When this type of current mode switching circuit is utilized as a logic gate, the difference in potential is achieved by applying relatively high (HI) and relatively low (LO) binary signal voltage levels to one transistor base electrode and a reference voltage ($V_{ref}$) to the other transistor base electrode. A value intermediate the HI and LO signal levels is assigned to $V_{ref}$, so that the potential difference between the two signal levels and $V_{ref}$ controls which of the transistors the current is routed through. This type of logic gate is sometimes called a current mode logic (CML) gate.

In the usual type CML gate, complementary outputs are taken from the collector electrodes of the two transistors. Each of the complementary outputs is often buffered by a separate emitter-follower (common collector) transistor. The dual emitter-follower transistors provide the CML gate with a low output impedance and provide signal level shift so that the output signal levels are of the same digital voltage levels as the binary input signals. Thus, the output terminals of one CML gate may be directly connected to the input terminals of not only one other CML gate, but also, due to the low output impedance, to the input terminals of several other CML gates.

Although the dual output emitter-follower transistors provide the aforementioned benefits, they also account for about two-thirds of the power dissipation in the CML gate. Although power dissipation is generally undesirable, it is particularly so when the CML gates are fabricated as integrated circuits wherein the dissipated heat can cause serious performance degradation. The present invention is directed to novel improvements in CML gates whereby the power dissipation in the output emitter-followers is reduced by a factor of one-half without loss of signal gain and without loss of high performance.

BRIEF SUMMARY OF INVENTION

According to the illustrated example of the invention, the load current switch means is comprised of a pair of transistors having their emitter electrodes connected to the common load current path and their collector electrodes connected to different ones of the output terminals. The base electrode of one of the transistor pair is connected to the second fixed reference voltage; while the base electrode of the other of the transistor pair is connected to the common emitter electrode connection of the two transistors which comprise the input signal current switch. This latter connection enables the load current switch to be operated without any significance delay since the signal propagates through only the base-emitter junction of one of the input signal transistors.

DESCRIPTION OF PREFERRED EMBODIMENTS

Current mode switching circuits according to my invention may be constructed either with discrete components or by means of integrated circuit processes. As used herein, the term, "integrated circuit" refers to those technologies by which an entire circuit can be formed as by diffusion or by films in or on one or more chips of materials such as silicon. Current mode switching circuits according to the present invention may either be fabricated on separate chips or fabricated in combination with other circuitry in or on the same substrate. As the case may be, the integrated circuit structures or chips so formed are useful as building blocks which may be interconnected and combined with appropriate power supplies and signal sources to form various systems.

Referring now to the sole figure of the drawing, there is shown generally at 10 a current mode switching circuit according to the invention wherein transistors 11 and 12 comprise an input signal current switch; while transistors 13 and 14 comprise an output or load current switch. The input signal switching transistors 11 and 12 have their collector electrodes 11*c* and 12*c* connected to a first supply connection 21 via collector resistors 17 and 18, respectively. The emitter electrodes 11*e* and 12*e* are connected to a common signal current path, illustrated as an emitter resistor 19. The other end of common emitter resistor 19 is connected to a second supply connection 22. The base electrode 12*b* is connected to a circuit 40 from which a first fixed reference voltage $V1_{ref}$ is derived; while the base electrode 11*b* is connected to receive binary input signals B.

Additional inputs to the current mode switching circuit may be provided by connecting the collector and emitter electrodes of additional transistors in parallel with the collector electrode 11*c* and emitter electrode 11*e* of transistor 11. For example, as illustrated by the dashed connections, further transistor 31 has its collector electrode 31*c* connected to the collector electrode 11*c* and its emitter electrode 31*e* connected to the emitter electrode 11*e*. The base electrode 31*b* is connected to receive further binary input signals A.

The collector electrodes 11*c* and 12*c* of the input signal current switch are further connected to the base electrodes 15*b* and 16*b* of dual output emitter-follower output transistors 15 and 16, respectively. Transistors 15 and 16 have their collector electrodes 15*c* and 16*c* connected to supply connection 21 and their emitter electrodes 15*e* and 16*e* connected to output terminals 25 and 26, respectively, at which complementary output signals C and $\overline{C}$ are developed.

The output or load current switching transistors 13 and 14 have their collector electrodes 13*c* and 14*c* connected to output terminals 25 and 26, respectively, and their emitter electrodes 13*e* and 14*e* connected together and via a common load current path, illustrated as an emitter resistor 20, to the second supply connection 22. Transistor 13 has its base electrode 13*b* connected to the emitter electrodes 11*e* and 12*e* of transistors 11 and 12, respectively. Transistor 14 has its base electrode 14*b* connected to the circuit 40 to receive a second fixed reference voltage $V2_{ref}$.

The circuit 40 from which the reference voltages $V1_{ref}$ and $V2_{ref}$ are derived is a voltage divider arrangement including a pair of resistors 41 and 42 and a pair of temperature compensating diodes 43 and 44 all connected in series between the supply connections 21 and 22. The diodes 43, 44 in practice, may be transistor devices arranged in known fashion to provide the desired diode action. The divider arrangement further includes a first driver transistor 45 which is connected in the common collector configuration. To this end, transistor 45 has its base electrode 45*b* connected to the common connection of resistors 41 and 42. The collector electrode 45*c* is connected to supply connection 21; while the emitter electrode 45*e* is connected by way of series connected resistors 46 and 47 to the other supply connection 22. The first reference voltage $V1_{ref}$ is derived from or tapped from the common connection of resistors 46 and 47; while the second reference voltage $V2_{ref}$ is derived from the emitter electrode 45*e* of the first driver transistor 45 by way of a second driver transistor 48, also connected in the common collector configuration. To this end, the transistor 48 has its collector electrode connected to the supply connection 21 and its emitter electrode 48*e* connected by way of a resistor 49 to the other supply connection 22. The reference voltage $V2_{ref}$ is derived directly from the emitter electrode 48*e* of the transistor 48.

A suitable source 35 of operating voltage of value E is connected between the supply connections 21 and 22. For the illustrated NPN-type transistors, the source 35 has its negative terminal connected to the supply connection 22 and its positive terminal connected to the supply connection 21, with the supply connection 21 being arbitrarily connected to a suitable reference potential, illustrated as circuit ground by the conventional symbol. It should be apparent that when PNP-type transistors are utilized in the current mode switching circuit, the polarity of the source 35 would be reversed.

The binary signals A and B and the output signals C and $\overline{C}$ have the well-known form of HI and LO voltage levels with transitions therebetween as illustrate by the waveform 36 at the base electrode 31*b*.

In the divider circuit 40 the driver transistors 45 and 48 are biased on and operate as emitter-follower types to provide the fixed reference voltages $V1_{ref}$ and $V2_{ref}$. The reference voltage $V1_{ref}$ has a value intermediate the HI and LO voltage levels $V_H$ and $V_L$ and, for the purpose of the description which follows is assumed to be midway therebetween or $$V1_{ref}=\frac{V_H+V_L}{2} \quad (1)$$

Similarly, the reference voltage $V2_{ref}$ has a value intermediate the signal level of the voltage $V_e$ at the base electrode 13*b* of transistor 13, and is likewise assumed to be midway therebetween.

The output terminals 25 and 26 are shown as connected to loads illustrated as capacitors $C_{L1}$ and $C_{L2}$. The capacitors $C_{L1}$ and $C_{L2}$ represent the total input capacitance of one or more input transistors of other CML gates which are being driven and also any other capacitance, such as wiring capacitance, which may be present at the output terminals 25 and 26.

OPERATION

Consider first the circuit operation without regard to the load current switching transistors 13 and 14 and assume that transistors 15 and 16 operates as emitter-followers having separate series emitter resistors. The common emitter resistor 19 and the voltage source 35 simulate a source of current for the current switching transistors 11 and 12. When either or both of the A and B signals is at the HI voltage level $V_H$ ($V_H > V1_{ref}$), the transistor 11 and/or 31, as the case may be, is turned on and the transistor 12 is turned off. The current source current is routed through the collector-emitter path of transistor 11 and/or 31, as the case may be, with the result that the voltage at the collector electrode 11*c* is at a relatively low level; while the voltage at collector electrode 12*c* is at a relatively higher level. These relatively low and high voltage levels are translated with level shift by the base-emitter junctions of transistors 15 and 16 to the output terminals 25 and 26, respectively, such that the output signals C and $\overline{C}$ are at the LO and HI levels, respectively.

On the other hand, when both of the binary signals A and B are at the LO voltage level $V_L$ ($V_L < V1_{ref}$), the transistors 11 and 31 are turned off and the transistor 12 is turned on. The current source is routed through the collector-to-emitter path of the transistor 12 with the result that the voltage at the collector electrode 12*c* is a a relatively low level; while the voltage at collector electrode 11*c* is at a relatively higher level. These relatively high and low voltage levels at collector electrodes 11*c* and 12*c* are translated with level shift by the base-emitter junctions of emitter-follower transistors 15 and 16 to the output terminals 25 and 26, respectively, such that the output signals C and $\overline{C}$ are at the HI and LO levels, respectively.

In summary, whenever either or both of the input signals A and B is at the HI level, the output C is at the LO level. It is only when both binary input signals A and B are at the LO level that the output signal C is at the HI level. Of course, the output signal $\overline{C}$ is the complement of the output signal C in each of the above cases. If the binary symbols 1 and 0 are assigned to the HI and LO levels, respectively, the circuit can be said to function as a NOR gate with respect to the output signal C and as an OR gate with respect to the output signal $\overline{C}$. On the other hand, if the binary symbols 1 and 0 are assigned to the LO and HI levels, respectively, the circuit can be said to function as a NAND gate with respect to the output signal C and as an AND gate with respect to the output signal $\overline{C}$.

In the prior art CML gates wherein emitter-follower transistors 15 and 16 had series-emitter resistors returned at their other ends to the source 35, current flowed in both resistors under steady state conditions to contribute about 67% of the total power dissipation of the gate. In the present invention under steady state conditions, the emitter current of only one of the dual emitter-follower transistors flows through the common emitter resistor 20 resulting in a 50% reduction of power dissipation in the emitter-follower circuits.

The common emitter resistor 20 and voltage source 35 simulate a further source of current for switching transistors 13 and 14 which respond to the binary input signals A and B to route the current of this further source to either one or the other but not both of the emitter-follower transistors 15 and 16. In essence, the higher level $V_{eh}$ of the signal $V_e$ is set when either of the transistors 11 or 31 is turned on ($A$ or $B=V_H$) and transistor 12 is turned off. For this condition $V_e=V_{eh}=V_H-V_{be}$, where $V_{be}$ is the voltage drop across the base-emitter junction of a conducting transistor, and is assumed to be the same for all the transistors. On the other hand, the lower level $V_{el}$ is determined when both transistors 11 and 31 are turned off and transistor 12 turned on ($A=B=V_L$). For this condition $V_e = V_{el} = V1_{ref} - V_{be}$. The choice of resistive components in the divider circuit 40 is such that $V2_{ref}$ is intermediate $V_{eh}$ and $V_{el}$. For the case where $V2_{ref}$ is midway therebetween, $$V2_{ref} = \frac{V_{eh} + V_{el}}{2} = \frac{1}{2}(V_H + V1_{ref}) - V_{be} \qquad (2)$$

Thus, when either or both of transistors 11 and 31 is turned on (B or A at the HI level) and transistor 12 turned off, transistors 13 and 14 are likewise turned on and off, respectively. For the other condition where both A and B are at the LO level, transistors 11, 31 and 13 are turned off and transistors 12 and 14 are turned on. Thus, depending upon the binary signal input conditions, one of the transistors 13 and 14 is turned on to route the current of the resistor 20 and source 35 current source to the associated emitter-follower output transistor and output terminal.

It should be noted that although transistor 13 may be turned off ($A = B = V_L$, $C = V_H$) to isolate emitter-follower transistor 15 from common emitter resistor 20, the latter transistor is still conducting (1) to provide a base current path for the input transistor of any CML gate connected to output terminal 25 and (2) to provide a leakage current path for transistor 13. Similar considerations apply to emitter-follower transistor 16 when $\overline{C} = V_H$.

According to the invention, the current mode logic circuit described above is improved by providing a load current switch means and a voltage divider arrangement for providing first and second different fixed reference voltages. The first fixed reference voltage corresponds to the aforementioned voltage $V_{ref}$; while the second reference voltage is applied to the load current switch. The load current switch has another input which responds to one binary input signal condition to connect a common load current path to one of the output terminals and responds to a different input signal condition to connect the common load current path to the other output terminal. Thus, the emitter curent of only one of the dual emitter-follower output transistors flows through the common load current path under steady state conditions.

While the present invention has been illustrated with bipolar transistors, the invention is not limited to amplifying devices of this type. Other amplifying devices, such as field-effect transistors, may also be employed in the practice of my invention.

What is claimed is:

1. In combination:

four transistors of the same conductivity type, each having a collector, emitter and base, the first and second being connected emitter-to-collector to form one output terminal, the third and fourth being connected emitter-to-collector to form a second output terminal, the first and third being connected collector-to-collector to form a third terminal and the second and fourth being connected emitter-to-emitter to form a fourth terminal;

fifth and sixth transistors of the same type as the first four transistors, the fifth connected at its collector to the base of the first transistor and at its emitter to the base of the second transistor, and the sixth transistor being connected at its collector to the base of the third transistor and at its emitter to the base of the second transistor and also to the emitter of the fifth transistor;

connections for a current source at said third and fourth terminals for the application of operating current to said first four transistors;

means for applying a first reference voltage to the base of the sixth transistor and a second reference voltage, different from the first reference voltage, to the base of the fourth transistor; and means for concurrently placing the fifth transistor in its conducting state and the sixth in its nonconducting state to render the third and second transistors conductive and said fourth transistor nonconductive, essentially all of the current flowing through the third transistor being supplied to said second output terminal, and for reversing the condition of the fifth and sixth transistors for rendering the first and fourth transistors conductive and the second nonconductive, essentially all of the current flowing through the first transistor being supplied to said one output terminal.

References Cited

UNITED STATES PATENTS

| | | | |
|---|---|---|---|
| 3,259,761 | 7/1966 | Narud et al. | 307—214 |
| 3,417,262 | 12/1968 | Yao | 307—215 |

DONALD D. FORRER, Primary Examiner

B. P. DAVIS, Assistant Examiner

U.S. Cl. X.R.

307—215, 218, 255, 296; 330—30